(12) United States Patent
Saita

(10) Patent No.: US 7,199,436 B2
(45) Date of Patent: Apr. 3, 2007

(54) ATTACHMENT STRUCTURE FOR SOLID-STATE IMAGING DEVICE

(75) Inventor: Arihiro Saita, Saitama (JP)

(73) Assignee: Fujinon Corporation, Saitama (JP)

( * ) Notice: Subject to any disclaimer, the term of this patent is extended or adjusted under 35 U.S.C. 154(b) by 641 days.

(21) Appl. No.: 10/184,973

(22) Filed: Jul. 1, 2002

(65) Prior Publication Data

US 2003/0020129 A1    Jan. 30, 2003

(30) Foreign Application Priority Data

Jul. 27, 2001 (JP) .............................. 2001-227017

(51) Int. Cl.
*H01L 21/00* (2006.01)
*H01L 31/0232* (2006.01)

(52) U.S. Cl. .................... 257/432; 257/433; 257/435; 257/436; 359/640; 359/638; 329/634

(58) Field of Classification Search ............. 257/432, 257/433, 435, 436; 438/48, 64, 65
See application file for complete search history.

(56) References Cited

U.S. PATENT DOCUMENTS

| 4,268,119 | A | * | 5/1981 | Hartmann | ............... | 359/634 |
| 4,814,895 | A | * | 3/1989 | Harada et al. | ............. | 358/514 |
| 5,042,913 | A | * | 8/1991 | Yamamoto | ................. | 359/540 |
| 6,614,478 | B1 | * | 9/2003 | Mead | ......................... | 348/337 |

FOREIGN PATENT DOCUMENTS

JP    HEI 3-14872    4/1991

* cited by examiner

*Primary Examiner*—Evan Pert
*Assistant Examiner*—Fazli Erdem
(74) *Attorney, Agent, or Firm*—Snider & Associates; Ronald R. Snider

(57) ABSTRACT

An attachment structure is used for attaching a solid-state imaging device to a light exit end face of a color-separating prism. When bonding the light exit end face on the color-separating prism side and the light entrance face on the solid-state imaging device side to each other, an adhesive is applied to a predetermined position between these faces outside a region through which a luminous flux incident on the imaging section of the solid-state imaging device passes.

3 Claims, 2 Drawing Sheets

DETAIL OF PART A

ATTACHMENT STRUCTURE FOR SOLID-STATE IMAGING DEVICE

RELATED APPLICATIONS

This application claims the priority of Japanese Patent Application No. 2001-227017 filed on Jul. 27, 2001, which is incorporated herein by reference.

BACKGROUND OF THE INVENTION

1. Field of the Invention

The present invention relates to an attachment structure for attaching a solid-state imaging device to each color light exit end of a color-separating prism. More specifically, it relates to an attachment structure for a solid-state imaging device for attaching the solid-state imaging device to a color-separating prism by using an adhesive.

2. Description of the Prior Art

Color-separating prisms for decomposing object light from an imaging lens into a plurality of wavelength region components and outputting thus obtained components have conventionally been known in video cameras and the like. Solid-state imaging devices corresponding to individual color light components are attached to the respective color light exit ends of such a color-separating prism, so as to receive their corresponding color light components from the exit end faces.

When the solid-state imaging devices receive light in this case, it is necessary that the superposition of objects in different colors, i.e., registration, be carried out at a high accuracy in order to prevent color misalignment, moiré, and the like from occurring. In particular, along with the recent tendency of solid-state imaging devices to attain a greater number of pixels, their pixel pitch has been decreasing remarkably, thus requiring a severe positional accuracy, which makes it necessary to attach the solid-state imaging devices to the color-separating prism while in a state securely positioned.

While a technique disclosed in Japanese Utility Model Publication No. HEI 3-14872 and the like has been known as prior art, it is desirable that the light exit end face on the color-separating prism side and the light entrance face on the solid-state imaging device side be directly bonded to each other with an adhesive when the easiness of attaching operations is important.

In the case of direct bonding with the adhesive, small bubbles and dust particles mixed into the adhesive exist within a region through which an incident luminous flux onto the imaging section of the solid-state imaging device passes, whereby captured images deteriorate greatly. When attaching the solid-state imaging device to the color-separating prism, it is necessary for individual color object images to be superposed at a high accuracy as mentioned above. Therefore, for example, they are held with a 6-axis adjusting jig or the like so as to oppose each other in a predetermined posture with a predetermined gap therebetween. Thereafter, a UV-curable adhesive or the like is injected throughout the gap and is cured upon UV irradiation, whereby the possibility of bubbles and the like once mixed into the adhesive being released is low. However, since bubbles as small as about 10 µm may still affect the image quality severely, it is hard for the above-mentioned technique to maintain the quality of captured images favorably.

SUMMARY OF THE INVENTION

In view of such circumstances, it is an object of the present invention to provide an attachment structure for a solid-state imaging device, which has a simple configuration and can prevent the image quality from deteriorating under the influence of bubbles and dust particles mixed into an adhesive even when the solid-state imaging device is attached to a light exit end face of a color-separating prism with the adhesive.

The present invention provides an attachment structure for a solid-state imaging device for attaching onto a light exit end side of a color-separating prism for decomposing incident object light into a plurality of wavelength region components a solid-state imaging device for capturing an object image for each wavelength region component;

wherein, when attaching the solid-state imaging device by bonding a light exit end face on the color-separating prism side and a light entrance face of the solid-state imaging device to each other, thus bonded area is located at a predetermined position outside a luminous flux passing region through which a luminous flux incident on an imaging section of the solid-state imaging device passes.

Preferably, the two faces bonded to each other oppose each other across a registration adjusting gap therebetween in the luminous flux passing region.

The color-decomposing prism is a Philips prism, for example.

A UV-curable adhesive, for example, is used for bonding the light exit end face and the light entrance face to each other.

Before curing, the adhesive preferably has a viscosity of 10 to 35 Pa·s, more preferably 15 to 30 Pa·s, 25 to 26 Pa·s in particular.

The light entrance face of the solid-state imaging device encompasses not only the light entrance face of the solid-state imaging device itself, but also the light entrance faces of cover glass sheets and other filters if they are attached to the former face.

DESCRIPTION OF THE PREFERRED EMBODIMENTS

In the following, an embodiment of the present invention will be explained with reference to the drawings.

Figure 1A:
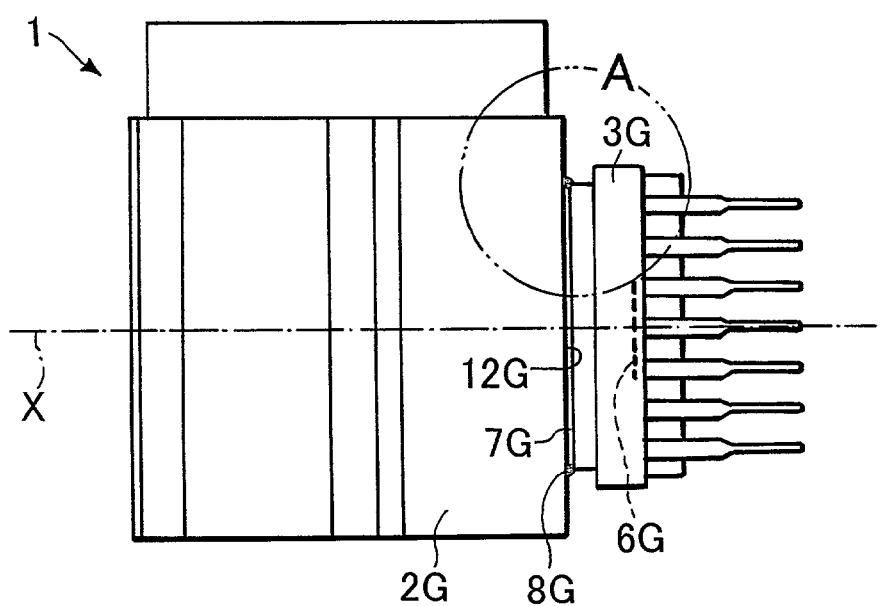
FIGS. 1A and 1B are plan and front views of a color-separating prism for explaining the attachment structure for a solid-state imaging device in accordance with an embodiment of the present invention, respectively.
Figure 1B:
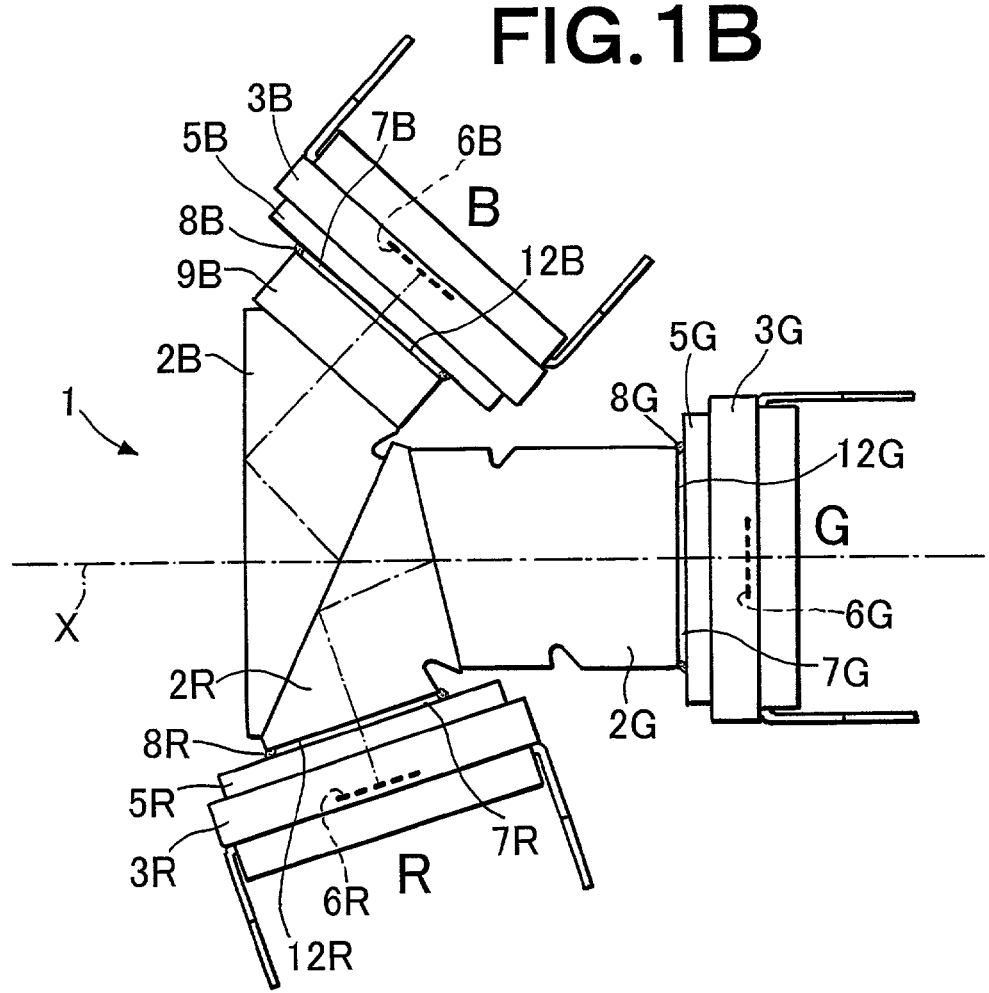
Figure 2:
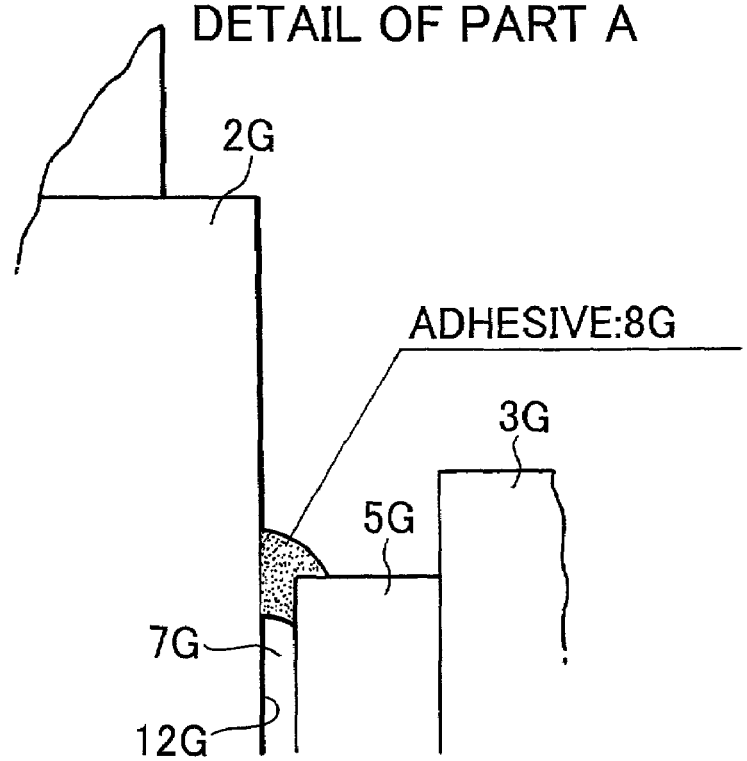
FIG. 2 is an enlarged view of part A in FIGS. 1A and 1B.

FIGS. 1A, 1B, and 2 are views showing a state where solid-state imaging devices are attached to a color-separating prism by an attachment structure for solid-state imaging devices in accordance with an embodiment of the present invention. Here, FIG. 1A is a plan view, FIG. 1B is a front view, and FIG. 2 is an enlarged view of part A in FIG. 1A.

As shown in FIGS. 1A and 1B, a color-separating prism 1 used in an optical system comprising the attachment structure for solid-state imaging devices in accordance with this embodiment is constituted by three prisms 2B, 2G, 2R in combination, whereas solid-state imaging devices (CCDs) 3B, 3C, 3R, which will be explained later, are held so as to oppose respective light exit faces 12B, 12G, 12R of the prisms 2B, 2G, 2R.

In this optical system, light carrying object information incident on the color-separating prism 1 from the left side of FIG. 1B is decomposed into three color light components of R, G, and B by the prisms 2B, 2G, 2R (in which the spectral characteristic of B is further adjusted by a trimming filter 9B for the prism 2B), and the three color light components of R, G, and B are made incident on respective imaging sections 6B, 6G, 6R of the solid-state imaging devices 3B, 3G, 3R arranged downstream. Cover glass sheets 5B, 5G, 5R are bonded to the respective light entrance faces of solid-state imaging devices 3B, 3G, 3R. Though not depicted, a filter member made of an infrared cut filter, an ND/color temperature conversion filter, a lowpass filter, and the like is disposed at the light entrance end face of the prism 2B.

The attachment structure for solid-state imaging devices in accordance with this embodiment will now be explained in detail. As mentioned above, for taking out electric signals of R, G, and B components, the solid-state imaging devices 3B, 3G, 3R are attached to the respective light exit faces 12B, 12G, 12R as shown in FIG. 1B. The color-separating prism 1 and solid-state imaging devices 3B, 3G, 3R are held by a holder (not depicted) movably provided on a base plate of an attachment jig (not depicted). This holder carries out 6-axis adjustment, whereby the solid-state imaging devices 3B, 3G, 3R are regulated so as to be able to maintain a predetermined posture while keeping necessary gaps 7B, 7G, 7R with respect to the light exit faces 12B, 12G, 12R of the color-separating prism 1. After this regulation, UV-curable adhesives 8B, 8G, 8R are injected into the gaps 7B, 7G, 7R, respectively. After whether the postures of solid-state imaging devices 3B, 3G, 3R with respect to the light exit faces 12B, 12G, 12R of the color-separating prism are favorable or not is verified again, the UV-curable adhesives 8B, 8G, 8R are irradiated with UV rays, whereby the solid-state imaging devices 3B, 3G, 3R are securely bonded and attached to the color-separating prism 1.

The solid-state imaging devices 3B, 3G, 3R are connected to a control unit (not depicted) including an image processing circuit, whereby a color object image is displayed onto a monitor, which is not depicted, according to image signals processed by the control unit.

In this embodiment, the bonding between the light exit faces 12B, 12G, 12R of the prisms 2B, 2G, 2R (the light exit face of the trimming filter 9B for the prism 2B) and the light entrance faces of cover glass sheets 5B, 5G, 5R is not effected over substantially all the region of each face but in predetermined regions at its four corners or along its two opposing (upper/lower or left/right) sides. The reason is as follows:

If the bonding between the light exit faces 12B, 12G, 12R of the prisms 2B, 2G, 2R (the light exit face of the trimming filter 9B for the prism 2B) and the light entrance faces of cover glass sheets 5B, 5G, 5R is effected over substantially all the regions opposing each other, luminous fluxes incident on the respective imaging sections 6B, 6G, 6R of solid-state imaging devices 3B, 3G, 3R will always be transmitted through an adhesive. Since the adhesive inherently contains bubbles and dust particles mixed therein, the luminous fluxes transmitted through the adhesive are scattered by the bubbles and dust particles, whereby the image quality of resulting images deteriorates. It is necessary that such bubbles be eliminated reliably, since they may greatly affect the deterioration of image quality even when their diameter is about 10 µm. In the state where the gap between the opposing faces is held as mentioned above, however, defoaming is hard to carry out in a period after the adhesive is injected into the gap until it cures. Therefore, in the above-mentioned embodiment, the regions injected (coated) with the adhesives 8B, 8G, 8R are corners and edges of surfaces opposing each other as mentioned above, through which the luminous fluxes incident on the respective imaging sections 6B, 6G, 6R of the solid-state imaging devices 3B, 3G, 3R do not pass.

Figure 3:
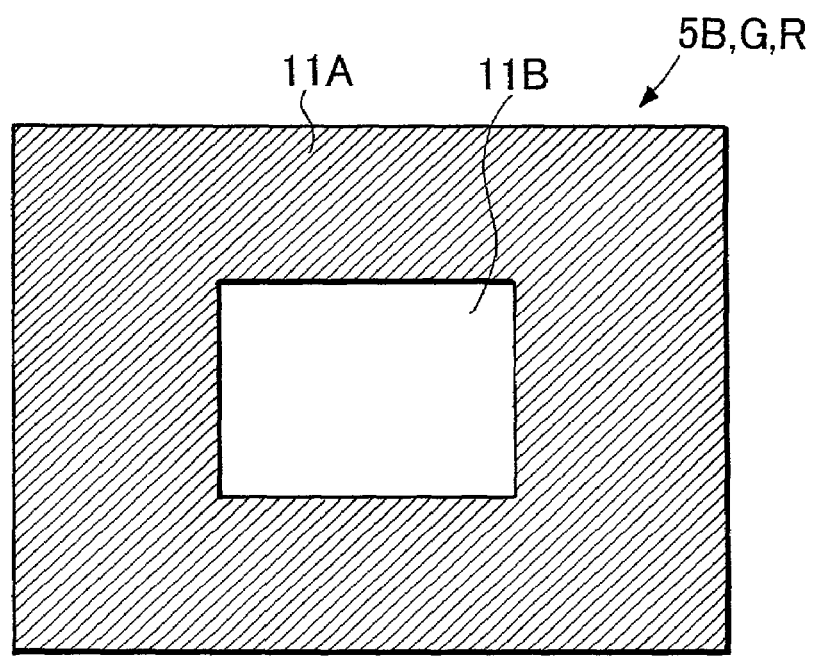
FIG. 3 is a view for explaining a bonded region in this embodiment.

Namely, as shown in FIG. 3, the regions injected with the adhesives 8B, 8G, 8R may be at any position on the light entrance surfaces of the cover glass sheets 5B, 5G, 5R within an external region 11A located on the outside of a region (hereinafter referred to as "imaging luminous flux passing region") 11B through which the luminous fluxes incident on the imaging sections 6B, 6G, 6R pass. For example, the regions may be areas located at four corners or along opposing two sides of the external region 11A as mentioned above, the whole area of the external region 11A, or the area along the whole length of each of the four sides of the external region 11A. However, it is necessary for the regions to have such a position and area that the attachment strength of solid-state imaging devices 3B, 3G, 3R can be secured.

Depending on the viscosity of adhesives, there is a fear of the adhesives 8B, 8G, 8R intruding into the imaging luminous flux passing region 11B due to dripping from the regions injected with the adhesives 8B, 8G, 8R. When each of the gaps 7B, 7G, 7R is 100 µm, for example, the adhesives 8B, 8G, 8R will be prevented from intruding into the imaging region 11B if the adhesives 8B, 8G, 8R have a viscosity of 10 to 35 Pa·s before curing. The viscosity is preferably 15 to 30 Pa·s, more preferably 25 to 26 Pa·s.

When the bonding portion between the prisms 2B, 2G, 2R and the solid-state imaging devices 3B, 3G, 3R is only a part of their corresponding opposing faces as in this embodiment, the width of gaps 7B, 7G, 7R can slightly be adjusted even after the adhesives 8B, 8G, 8R are injected into the gaps 7B, 7G, 7R, whereby the registration of individual color object images can finely be adjusted.

After the bonding is completed as mentioned above, the color-separating prism 1 having the solid-state imaging devices 3B, 3G, 3R attached thereto is removed from the jig. Then, as means for protecting the imaging surfaces of the solid-state imaging devices 3B, 3G, 3R against dust, the respective gaps 7B, 7G, 7R between the prisms 2B, 2G, 2R and the solid-state imaging devices 3B, 3G, 3R are sealed with a silicone type sealing material and the like.

At least one of the surfaces opposing each other across the gaps 7B, 7G, 7R may be provided with an antireflection film.

Though the attachment structure for a solid-state imaging device in accordance with the present invention is a structure for attaching solid-state imaging devices to a color-separating prism, the concept of the present invention also encompasses cases where optical members such as a trimming filter attached to exit ends of the color-separating prism are bonded to the solid-state imaging devices as mentioned above.

Though the UV-curable adhesive is used as the adhesive in the above-mentioned embodiment, the adhesive in the attachment structure for solid-state imaging devices in accordance with the present invention is not limited thereto as a matter of course.

In the attachment structure for a solid-state imaging device in accordance with the present invention, as explained in detail in the foregoing, when bonding the light exit end face on the color-separating prism side and the light entrance face on the solid-state imaging device side to each other, an adhesive is applied to a predetermined position on the faces to be bonded together outside a region through which a luminous flux incident on the imaging section of the solid-state imaging device passes. Therefore, in a simple configuration, the bubbles and dust particles mixed into the adhesive can be kept from being positioned within the optical path, whereby the quality of captured images can be prevented from deteriorating due to the existence of bubbles and the like.

What is claimed is:

1. An attachment structure for a solid-state imaging device for attaching onto a light exit end side of a color-separating prism for decomposing incident object light into a plurality of wavelength region components a solid-state imaging device for capturing an object image for each wavelength region component;

wherein, when attaching said solid-state imaging device by bonding a light exit end face on said color-separating prism side and a light entrance face of said solid-state imaging device to each other, an adhesive is applied to a predetermined position between the light exit end face and light entrance face, thus a bonded area is located at a predetermined position outside a luminous flux passing region through which a luminous flux incident on an imaging section of said solid-state imaging device passes;

wherein a UV-curable adhesive is used for bonding said light exit end face and said light entrance face to each other; and wherein said adhesive has a viscosity of 10 to 35 Pa·s before curing.

2. An attachment structure for a solid-state imaging device for attaching onto a light exit end side of a color-separating prism for decomposing incident object light into a plurality of wavelength region components a solid-state imaging device for capturing an object image for each wavelength region component;

wherein, when attaching said solid-state imaging device by bonding a light exit end face on said color-separating prism side and a light entrance face of said solid-state imaging device to each other, an adhesive is applied to a predetermined position between the light exit end face and light entrance face, thus a bonded area is located at a predetermined position outside a luminous flux passing region through which a luminous flux incident on an imaging section of said solid-state imaging device passes;

wherein a UV-curable adhesive is used for bonding said light exit end face and said light entrance face to each other; and wherein said adhesive has a viscosity of 15 to 30 Pa·s before curing.

3. An attachment structure for a solid-state imaging device for attaching onto a light exit end side of a color-separating prism for decomposing incident object light into a plurality of wavelength region components a solid-state imaging device for capturing an object image for each wavelength region component;

wherein, when attaching said solid-state imaging device by bonding a light exit end face on said color-separating prism side and a light entrance face of said solid-state imaging device to each other, an adhesive is applied to a predetermined position between the light exit end face and light entrance face, thus a bonded area is located at a predetermined position outside a luminous flux passing region through which a luminous flux incident on an imaging section of said solid-state imaging device passes;

wherein a UV-curable adhesive is used for bonding said light exit end face and said light entrance face to each other; and wherein said adhesive has a viscosity of 25 to 26 Pa·s before curing.

* * * * *